United States Patent
Spehl

(10) Patent No.: US 11,031,944 B2
(45) Date of Patent: Jun. 8, 2021

(54) SYSTEMS FOR TRANSPORTING EXTERNALLY RECEIVED SIGNALS WITHIN A MOTOR VEHICLE

(71) Applicant: AUDI AG, Ingolstadt (DE)

(72) Inventor: Jürgen Spehl, Wettstetten (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 16/969,658

(22) PCT Filed: Jan. 21, 2019

(86) PCT No.: PCT/EP2019/051309
§ 371 (c)(1),
(2) Date: Aug. 13, 2020

(87) PCT Pub. No.: WO2019/162005
PCT Pub. Date: Aug. 29, 2019

(65) Prior Publication Data
US 2020/0403628 A1 Dec. 24, 2020

(30) Foreign Application Priority Data
Feb. 20, 2018 (DE) ..................... 10 2018 202 544.4

(51) Int. Cl.
H03M 1/66 (2006.01)
H03M 1/02 (2006.01)
H03M 1/74 (2006.01)

(52) U.S. Cl.
CPC ............ *H03M 1/02* (2013.01); *H03M 1/662* (2013.01); *H03M 1/74* (2013.01)

(58) Field of Classification Search
CPC .......... H03M 1/02; H03M 1/662; H03M 1/74; H04W 4/40; H04B 1/40; H04B 1/3822; H04B 1/28; H04B 1/0458; H04B 1/01
(Continued)

(56) References Cited

U.S. PATENT DOCUMENTS 5,678,219 A 10/1997 Agarwal et al.
7,239,222 B2 7/2007 Nagaishi et al.
(Continued)

FOREIGN PATENT DOCUMENTS

DE 69219809 T2 8/1997
DE 60218101 T2 8/2007
(Continued)

OTHER PUBLICATIONS

International Search Report and Written Opinion of the International Searching Authority directed to related International Patent Application No. PCT/EP2019/051309, dated Jun. 18, 2019, with attached English-language translation; 36 pages.
(Continued)

*Primary Examiner* — Khai M Nguyen
(74) *Attorney, Agent, or Firm* — Sterne, Kessler, Goldstein & Fox P.L.L.C.

(57) ABSTRACT

The present disclosure relates to a system for exchanging signals between a device of a vehicle and an external apparatus outside the vehicle via at least one antenna of the vehicle, wherein high-frequency signals are exchanged between the at least one external apparatus and the at least one antenna of the vehicle via electromagnetic waves, wherein the at least one antenna is connected via at least one first path to a first end of a line of the vehicle, and the device is connected via at least one second path to a second end of the line of the vehicle, wherein the system has at least one frequency reduction module which is arranged along at least one of the paths, and wherein the at least one frequency reduction module is designed to adjust a value of a frequency of the high-frequency signals to a low value prior to transport along the line.

10 Claims, 3 Drawing Sheets

(58) Field of Classification Search
USPC .......................................... 341/110, 144, 155
See application file for complete search history.

(56) References Cited

U.S. PATENT DOCUMENTS

| | | | |
|---|---|---|---|
| 8,817,727 B2* | 8/2014 | Usui | H04W 28/18 |
| | | | 370/329 |
| 10,187,103 B2 | 1/2019 | Spehl | |
| 10,347,992 B2 | 7/2019 | Kim | |
| 10,567,030 B2 | 2/2020 | Spehl | |
| 2009/0021436 A1 | 1/2009 | Clymer et al. | |
| 2010/0234071 A1* | 9/2010 | Shabtay | H04B 7/155 |
| | | | 455/562.1 |
| 2017/0110790 A1 | 4/2017 | Kim | |
| 2017/0149130 A1 | 5/2017 | Kim | |
| 2019/0011532 A1 | 1/2019 | Loesch et al. | |

FOREIGN PATENT DOCUMENTS

| | | |
|---|---|---|
| DE | 102015201476 A1 | 7/2016 |
| DE | 102015012893 A1 | 4/2017 |
| DE | 102016211890 A1 | 5/2017 |
| DE | 102016203160 A1 | 8/2017 |
| DE | 102016007193 A1 | 12/2017 |

OTHER PUBLICATIONS

International Preliminary Report on Patentability directed to related International Patent Application No. PCT/EP2019/051309, completed May 28, 2020, with attached English-language translation; 15 pages.

* cited by examiner

SYSTEMS FOR TRANSPORTING EXTERNALLY RECEIVED SIGNALS WITHIN A MOTOR VEHICLE

TECHNICAL FIELD

The present disclosure relates to a first system, a second system and a method for transmitting signals

BACKGROUND

Signals can be exchanged by radio via electromagnetic waves between two apparatuses, for example, between two vehicles. These signals usually have a defined frequency. As soon as such a signal has been received by one of the apparatuses, usually by its antenna, it is further processed within the device.

Document DE 10 2016 211 890 A1 describes an antenna for a vehicle, which is designed to transmit and receive radio wave signals in the millimeter band for fifth generation (5G) communication.

Reference is also made to publications US 2017/110790 A1 and US 2017/149130 A1, in which similar antennas are described.

Against this background, a problem was to adapt signals that are received by radio from an antenna for further processing.

BRIEF DESCRIPTION OF DRAWINGS/FIGURES

DETAILED DESCRIPTION

Figure 1:
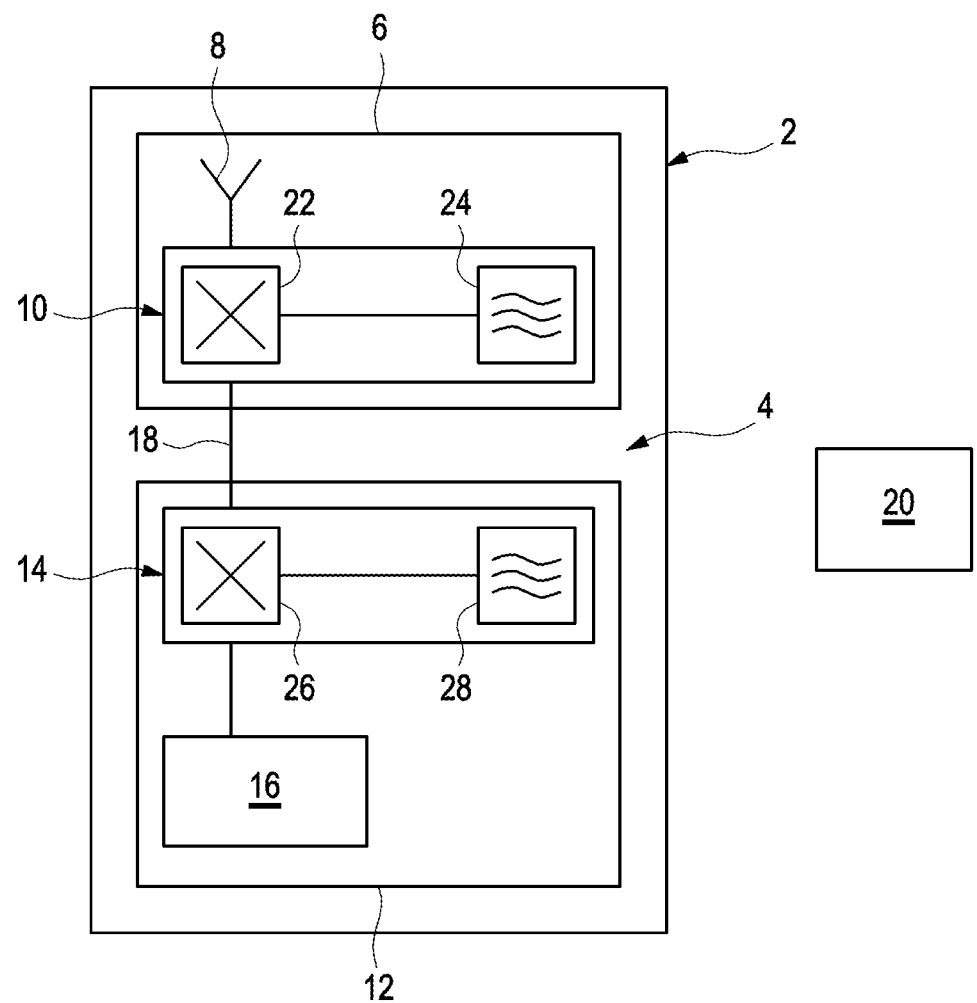
FIG. 1 shows a schematic representation of a first embodiment of a system, in accordance with some embodiments.

This problem is addressed by a first system, a second system and a method having the features of the independent claims. Embodiments of the systems and the method emerge from the dependent claims.

The first system according to some embodiments is designed for exchanging signals between a device of a vehicle and an external apparatus outside the vehicle via at least one antenna of the vehicle, wherein high-frequency signals, that is to say signals that have a frequency with a first high value, and that are optionally analog, are exchanged or must be exchanged between the at least one external apparatus and the at least one antenna of the vehicle via electromagnetic waves. The at least one antenna is connected via at least one first path to a first end of an electrically conductive line of the vehicle, for example, made of metal. The device is connected to a second end of the line of the vehicle via at least one second path. The system has at least one signal conversion module designed as a frequency reduction module, which is arranged along at least one of the paths, that is to say in particular along the first path and/or along the second path. The at least one frequency reduction module is designed to adjust the high value of the frequency of the respective high-frequency signals to a prespecified second reduced or low value, for example, before its transport along the line, and accordingly to generate low-frequency signals.

The second system according to some embodiments is also designed for exchanging signals between a device of a vehicle and an external apparatus outside the vehicle via at least one antenna of the vehicle, wherein high-frequency signals, that is to say signals which typically have a frequency with a high value, and are analog or have an analog structure, are exchanged or must be exchanged between the at least one external apparatus and the at least one antenna of the vehicle via electromagnetic waves. The at least one antenna is connected via at least one first path to a first end of an electrically conductive line of the vehicle, for example, made of metal. The device is also connected to a second end of the line of the vehicle via at least one second path. The system has at least one signal conversion module designed as an analog-to-digital converter, which is arranged along at least one of the two paths, that is to say in particular along the first path and/or along the second path. The at least one analog-to-digital converter is designed as a structure conversion module to digitize the signals before their transport along the line, that is to say to convert their structure or form from analog to digital.

In both systems, it is possible for the at least one antenna and at least one signal conversion module, that is to say the frequency reduction module or the digital-to-analog converter, to be arranged along the at least one first path and/or at the first end of the line of the vehicle in and/or on a shared chip and/or module, for example a semiconductor element.

In some embodiments, a system may have at least one signal conversion module designed as a frequency increasing module, in particular a frequency conversion module, and/or at least one signal conversion module designed as a digital-to-analog converter, in particular a structure conversion module, which is arranged along at least one of the paths. The at least one frequency increasing module of the first system is designed to adjust the low value of the frequency of the low-frequency signals after the transport along the line back to the originally high value of the frequency. By way of a non-limiting example, the at least one digital-to-analog converter of the second system is designed to analogize the signals after their transport along the line, that is to say to convert their structure or form from digital to analog.

In some embodiments, a combination of both of the aforementioned systems comprises the at least one signal conversion module designed as a frequency-increasing module and the at least one signal conversion module designed as an analog-to-digital converter, and optionally also comprises the at least one frequency-increasing module and the at least one digital-to-analog converter. At least one of the named signal conversion modules is arranged along at least one of the two described paths.

The method according to some embodiments is designed and/or provided for exchanging signals between at least one device of a vehicle and at least one external apparatus with an embodiment of at least one of the presented systems.

In accordance with some embodiments, in the method, the high-frequency signals are exchanged between at least one antenna of the vehicle and the external apparatus, for example an antenna of this apparatus, via electromagnetic waves which have a frequency with a high value, and which are also analog, by way of example. The at least one antenna is connected to a first end of a line of the vehicle via at least one first path, and the device is connected to a second end of the line of the vehicle via at least one second path. In the method, the high value of the frequency of the signals before the transport along the line is adjusted to the low value with at least one signal conversion module which is designed as a frequency reduction module and is arranged along at least one of the paths. By way of a non-limiting example, the analog and high-frequency signals are digitized by means of at least one signal conversion module designed as an analog-to-digital converter and arranged along at least one of the two paths, before being transported along the line.

The high value of the frequency of the high-frequency signals is at least as high as 5 GHz, preferably at least as high as 5.9 GHz, particularly preferably at least as high as 6 GHz, more preferably at least as high as 26 GHz, even more preferably at least as high as 28 GHz, or at least as high as 70 GHz.

In some embodiments, in the method, signals that are transported along the line are set to a low frequency or to a frequency with a low value and/or digitized, whereas the signals for transport via electromagnetic waves are set to a high frequency and are analog and/or set as analog.

The frequency with the low value corresponds to at least one single-digit integer fraction of the high value of the frequency, for example, a maximum of 2 GHz or a maximum of 1 GHz.

For a 5G standard according to a fifth generation for mobile networks, during the communication between the at least one device of the vehicle and the at least one apparatus outside the vehicle by exchanging, and thus sending and/or receiving signals via electromagnetic waves, for these signals the first high frequency is used for the high-frequency signals, with a value that is ≥5.9 GHz, ≥6 GHz, ≥26 GHz, ≥28 GHz or ≥70 GHz.

The high-frequency signals can be transmitted between the at least one antenna and the external apparatus via different mobile radio standards, for example WLAN, pWLAN, LTE, Bluetooth, BTLE, GSM, or UMTS, wherein a high bandwidth is achieved for the signals.

In some embodiments, in the context of the method presented, the signals which have the first high frequency are exchanged outside the vehicle between the at least one antenna of the vehicle and the at least one external apparatus which has an antenna or is designed as such. This external apparatus is a further vehicle, by way of example, a fixed infrastructure device, by way of example, or a mobile communication device, by way of example, for example a cell phone, smartphone, laptop or other computer.

In some embodiments, these high frequency and generally analog signals received by the antenna are reduced by the at least one signal conversion module, which is connected downstream of the at least one antenna and is designed as a frequency reduction module and/or analog-to-digital converter, by reducing the frequency from the first high frequency to second low frequency, and/or digitized by digitization.

It is thereby achieved that signals modified in this way reduce line losses and thus cable losses during further transmission within the vehicle via the line, for example a cable, to the at least one device. If such a line is designed, for example, as an approximately 1.5-meter-long coaxial cable, line losses can thus be avoided which otherwise could be approximately 57% given the above-mentioned values for the first high frequency of the signals—of, for example, 6 GHz. It is thus possible to reduce line attenuation or cable attenuation as line loss. Implementing the method makes it possible now to use lines with a length of several meters, for example 6 meters, between the at least one antenna and the at least one device.

In one embodiment of the method, signals which comprise or contain data which are used for autonomous driving of the vehicle are also exchanged between the at least one device of the vehicle, for example in the form of a control device, and the at least one external apparatus, for example another vehicle. This data is exchanged directly between the antenna of the vehicle and the device. Thus, for example, two vehicles can directly exchange high-frequency signals via their antennas, the frequency of which is reduced for transport via a line to a device of each vehicle, and/or the structure or shape of which is digitized.

In the method, the at least one signal conversion module designed as a frequency reduction module mixes the first high frequency as the useful frequency of the high-frequency signals as part of a so-called down-conversion to a lower or deeper intermediate frequency, for example to a frequency having the second low value. The low-frequency signals generated in this case have the second low value for the frequency of at most 2 GHz. It is also possible, depending on the bandwidth of the frequencies, to mix the frequency of high-frequency signals cascaded in multiple steps from the first high value to the second low value being targeted, and thus to reduce them, wherein several frequency-reduction modules connected in series can be used. A frequency reduction or frequency drop proposed in this case as a possible frequency conversion is carried out by the at least one frequency reduction module directly after the antenna or in a transceiver, that is to say a transmitter and a receiver, as the at least one signal conversion module, provided that a chip and/or an electronic component which comprises this transceiver has at least one incoming and/or outgoing interface for signals with the given intended frequency.

By way of a non-limiting example, high-frequency signals with the first high value for the frequency, which are present as analog signals, are digitized by an analog-to-digital converter as the signal conversion module.

In both cases, there are further automated application options for the at least one antenna and the at least one device of the vehicle. For example, it is possible, by multiplexing, to exchange the signals to be exchanged between the at least one antenna and/or the at least one device via only one line, it being possible for a network of a plurality of such lines, which connects the at least one antenna and/or at least one device, to have a star-shaped or ring-shaped topology. It is thus possible to reduce the effort for laying lines and/or the effort for cabling and the resulting costs for an infrastructure to connect the at least one antenna and/or the at least one device in the vehicle.

In addition, by way of a non-limiting example, it is possible to integrate the at least one antenna and the at least one signal conversion module—that is, the at least one frequency reduction module, the at least one frequency increasing module, the at least one analog-to-digital converter, the at least one digital-to-analog converter and/or the at least one transceiver, in the case of an active antenna—directly into the silicon of a module as an embedded antenna in a semiconductor substrate or chip. However, a classic integrated structure is also possible, which comprises the at least one antenna, a phase array, a drive network and/or a phase shifter and a transformation network and/or a preamplifier as the at least one possible signal conversion module.

The features mentioned above and those yet to be explained below can be used not only in the combination specified in each case, but also in other combinations or on their own without departing from the scope of the present disclosure.

The figures are described as interrelated and overlapping. The same components are assigned the same reference numbers.

FIG. 1 shows a schematic representation of a first embodiment of a system when a first embodiment of the method is carried out in accordance with some embodiments. FIG. 1 shows a vehicle 2 designed in this case as a motor vehicle, which comprises the first embodiment of the system 4 according to the invention. The vehicle 2 has a communication unit 6 which has an antenna 8 and a frequency reduction module 10 connected downstream of the antenna 8 as the first frequency conversion module and as the first signal conversion module, wherein the antenna 8 and the frequency reduction module 10 are integrated in this case in a chip as a module. In addition, the vehicle 2 comprises a device 12 designed in this case as a control device, having a frequency increasing module 14 as the second frequency conversion and signal conversion module, and a transceiver 16. The communication unit 6 and the device 12 in this case are connected to each other electrically, via a physical line 18 of the vehicle 2, made of copper, for example, or of another, electrically conductive material. The antenna 8 is connected to a first end of the line 18 via a first path and the device 12 is connected to a second end of the line 18 via a second path. One frequency conversion module is arranged along each of the paths—that is, the frequency reduction module 10 is arranged along the first path and the frequency increasing module 14 is arranged along the second path.

In this case, at least the components of the communication unit 6 and the line 18 are also designed as components of the first embodiment of the system 4. FIG. 1 also shows an external apparatus 20 outside the vehicle 2.

In the first embodiment of the method, the antenna 8 and the external apparatus 20 exchange high-frequency signals via electromagnetic waves. In this case, the high-frequency signals have an analog structure—that is, are analog—and a frequency with which the high-frequency signals are exchanged has a first high value, which corresponds here to at least 5.9 GHz, by way of example. If signals with the first high value for the frequency are received by the antenna 8, their frequency is converted by the first frequency reduction module 10, in this case by a mixer 22 and a variable frequency oscillator 24 of the frequency reduction module 10, to a second low value, providing an intermediate frequency, and is thus reduced, wherein a so-called down-conversion is carried out. These generated low-frequency signals with the second low value for the frequency of, in this case, for example a maximum of 2 GHz, are further transmitted via the line 18 to the device 12, and are further converted by the frequency-increasing module 14 in the device 12, which also has a mixer 26 and a frequency oscillator 28, to a higher value, for example the original first high value, as part of a so-called up-conversion, and thus increased, wherein these high-frequency signals are relayed to the transceiver 16 of the device 12 and processed further.

Conversely, if originally high-frequency signals are to be transmitted from the device 12 via the line 18 and the antenna 8 to the external apparatus 20 as part of the exchange of signals, a further frequency reduction module (not shown here) along the second path is used to adjust the frequency for these signals to the second low value. These low-frequency signals are further transmitted to the communication unit 6 via the line 18. Furthermore, the frequency of the low-frequency signals is increased to the first high value by a further frequency-increasing module (not shown here) along the first path. Furthermore, the high-frequency signals are transmitted by the antenna 8 to the external apparatus 20.

Figure 2:
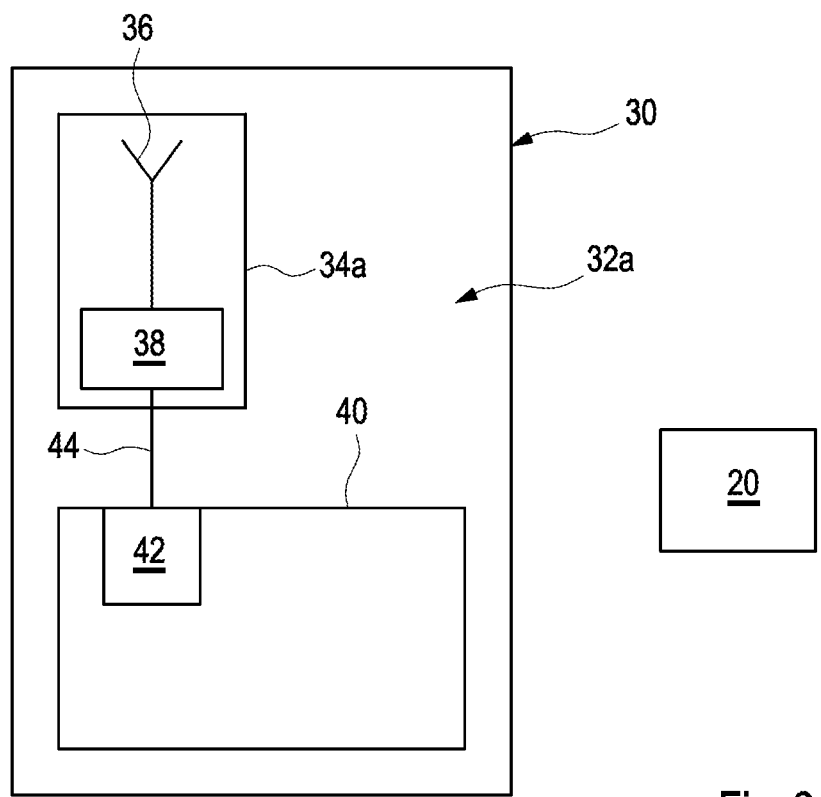
FIG. 2a shows a schematic representation of a variant of second embodiment of the system, in accordance with some embodiments.
FIG. 2b shows a schematic representation of another variant of second embodiment of the system, in accordance with some embodiments.
Figure 2:
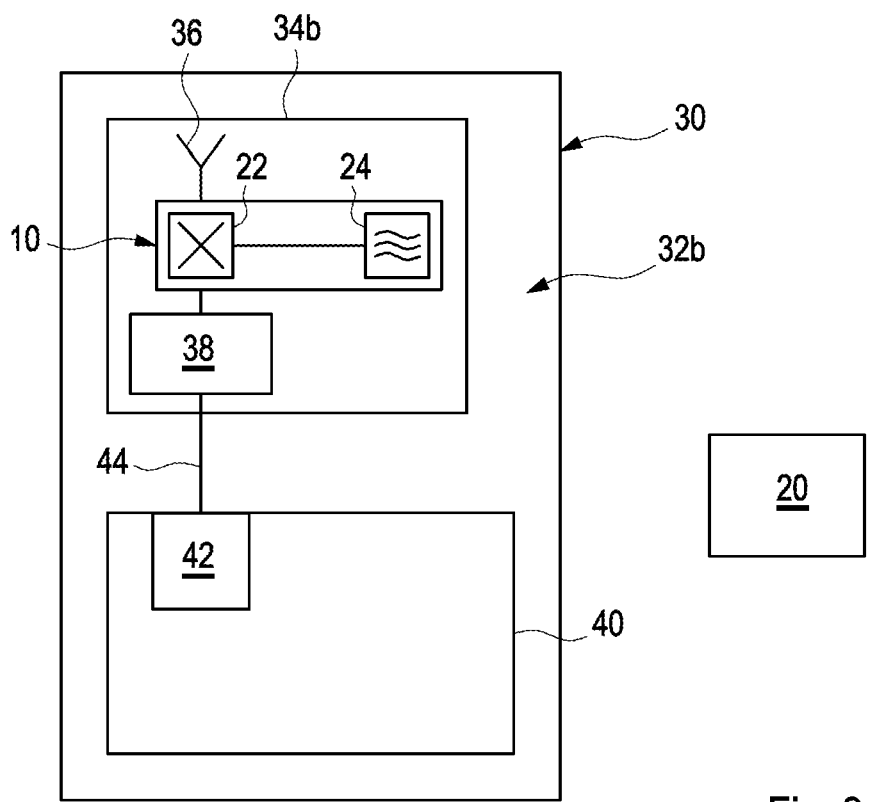

FIGS. 2a and 2b each show a schematic representation of a vehicle designed as a motor vehicle 30, which has a first variant of the second embodiment of the system 32a as shown in FIG. 2a, and a second variant of the second embodiment of the system 32b as shown in FIG. 2b. In both variants, the vehicle 30 comprises a communication unit 34a or 34b with an antenna 36 and at least one signal conversion module 38, which is designed in this case and/or can be designated here as a structure conversion module. The antenna 36 and the analog-to-digital converter 38 are integrated in one chip. In addition, in both variants, the vehicle 30 has a device 40 designed here as a control device, at the input of which a further signal conversion module, in particular a structure conversion module, is arranged, which is designed in this case as a digital-to-analog converter 42. Furthermore, the communication unit 34a and/or 34b and the device 40 are connected to each other via a physical line 44 of the vehicle 30. The antenna 36 is connected to a first end of line 44 via a first path and the device 40 is connected to a second end of the line 44 via a second path. One structure conversion module is arranged along each of the paths—that is, the analog-to-digital converter 38 is arranged along the first path, and the digital-to-analog converter 40 is arranged along the second path.

In addition, both FIGS. 2a, 2b show an external apparatus 20 outside the vehicle 30. In both variants of the second embodiment of the method according to the invention, signals are exchanged between the device 40 of the vehicle 30 and the external apparatus 20. In this case, analog high-frequency signals are exchanged between the antenna 36 and the external apparatus 20 via electromagnetic waves which have a frequency with a first high value.

In the first variant of the second embodiment of the method, at least the antenna 36 and the two structure conversion modules are used as components of the first variant of the embodiment of the system 32a. As soon as the antenna 36 receives an analog high frequency signal with the frequency with the first high value, it is digitized based on its analog structure by the first structure conversion module, which is designed in this case as an analog-to-digital converter 38. The now-digitized signal is further transmitted via the line 44, which is made of copper or another electrically conductive material, to the second structure conversion module, which is designed in this case as a digital-to-analog converter 42, is analogized by the same, and thus converted into an analog structure and provided to the device 40 for further processing.

If, conversely, a signal will be sent from the device 40 to the external apparatus 20, the originally-analog signal is converted along the second path into a digital signal by an analog-to-digital converter (not shown), as the structure conversion module, and transmitted along the first path via the line 44 to a digital-to-analog converter (not shown), as the structure conversion module. This transmitted digital signal is further converted by the digital-to-analog converter back into an analog signal, which is further relayed by the antenna 36 to the apparatus 20, and thus transmitted.

In the second variant of the second embodiment of the system 32b according to the invention, the second variant of the communication unit 34b additionally has a signal conversion module, which is designed in this case as a frequency reduction module 10, and also has a mixer 22 and a variable frequency oscillator 24, and is also integrated in a chip along with the antenna 36 and the analog-to-digital converter 38. In the second variant of the second embodiment of the method, the analog high frequency signal, which here has the frequency with the first high value, is relayed by the external apparatus 20 and thus transmitted to the antenna 36.

At this point, in addition to the first variant of the second embodiment of the method, the frequency of the analog signal received by the antenna 36 is reduced by the frequency reduction module 10 as part of a down-conversion to a second low value, and is subsequently digitized by the analog-to-digital converter 38. This digitized low-frequency signal with the second low value for the frequency is further transmitted via line 44 to the digital-to-analog converter 42 at the input or output of the device 40. Conversely, a digital signal with the second low value for the frequency, proceeding from the device 40, is in this case first transmitted via line 44 to the digital-to-analog converter in the communication unit 34b and is analogized by the same. Furthermore, the frequency of the now-analogized signal is increased to the first high value along the first path by a frequency increasing module (not shown), and the high frequency signal generated in this process is transmitted by the antenna 36 to the external apparatus 20.

Figure 3:
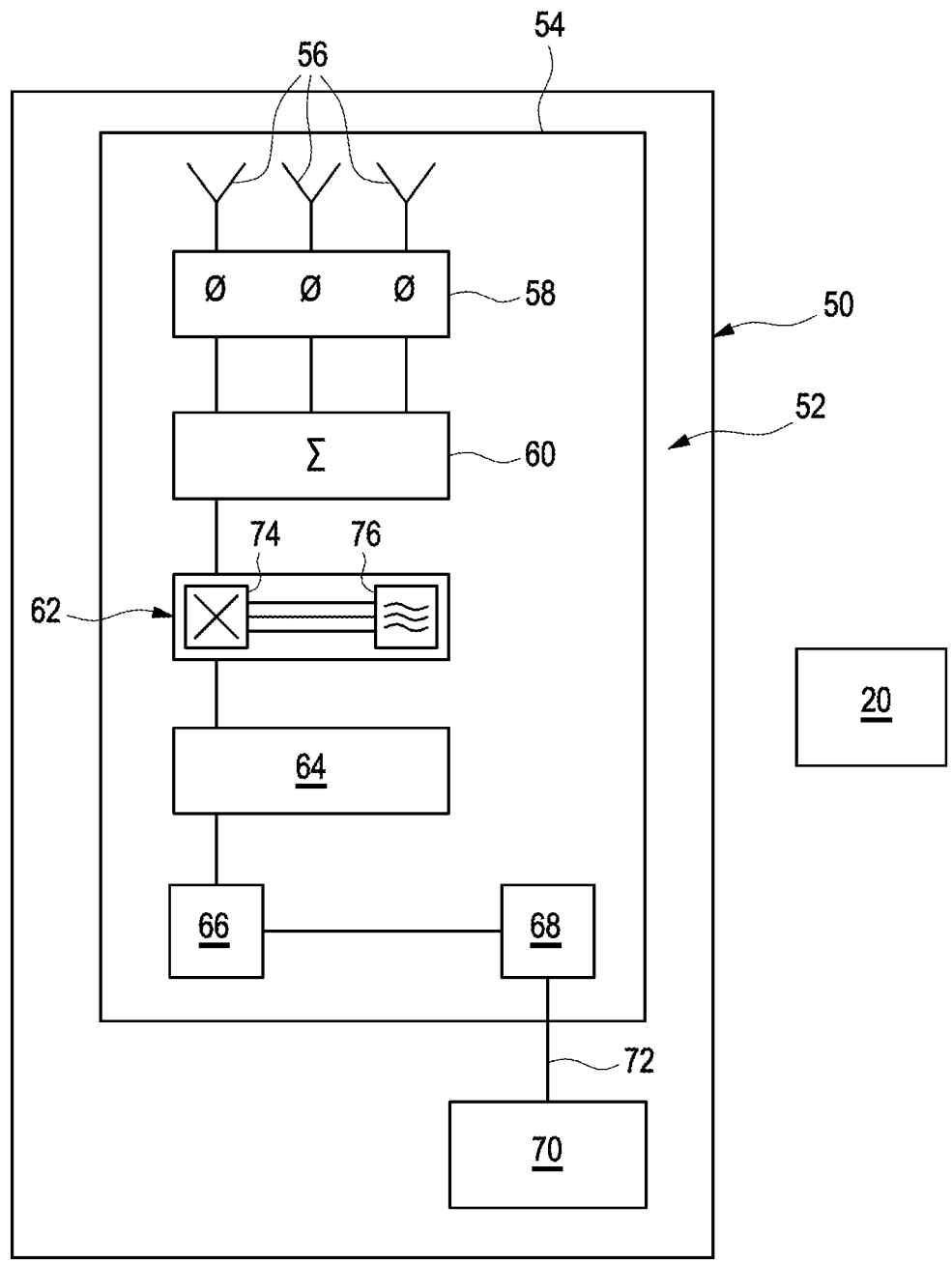
FIG. 3 shows a schematic representation of a third embodiment of the system, in accordance with some embodiments.

FIG. 3 shows a schematic representation of a further vehicle 50 which is designed as a motor vehicle and which comprises the third embodiment of the system 52 according to the invention. The vehicle 50 has a communication unit 54 which has three antennas 56 in this case, which form an antenna array, and has a phase shifter 58 connected downstream of the antennas 56, a combiner 60 connected downstream of the phase shifter 58, and a frequency reduction module 62, as the signal conversion module, connected downstream of the combiner 60 and the antennas. Furthermore, the communication unit 54 has a filter front end 64 downstream of the frequency reduction module 62, a transceiver 66 connected downstream thereof, and a downstream interface 68—in this case a digital interface for an Ethernet. Here, all components of the communication unit 54 are integrated into and/or on a chip.

In addition, the vehicle 50 comprises a device 70 designed in this case as a control device. The communication unit 54 and the device 70 are connected to each other via a physical, electrically conductive line 72 of the vehicle 50 formed from metal. In this case, at least the components of the communication unit 54 and the line 72 are also designed as components of the third embodiment of the system 52. FIG. 3 further shows the external apparatus 20 outside of the vehicle 50. The antennas 56 are connected to a first end of the line 72 via a first path, and the device 70 is connected to a second end of the line 72 via a second path. The frequency reduction module 62 is arranged along the first path.

In the third embodiment of the method, the antennas 56 and the external apparatus 20 exchange high-frequency signals via electromagnetic waves. In this case, the signals have an analog structure or shape and are accordingly analog, and a frequency with which the high-frequency signals are exchanged has a first high value which corresponds here, for example, to at least 5.9 GHz. If high-frequency signals with the first high value for the frequency are received by the antennas, these are first bundled by the phase shifter 58 and combined by the combiner 60, the signals still having the frequency with the first high value after such processing. The frequency of the signals from the frequency reduction module 62, in this case from a mixer 74 and a variable-frequency oscillator 76 of the frequency reduction module 62, is then converted to a second low value for the frequency and/or to an intermediate frequency, and thus reduced, wherein a so-called down-conversion is carried out. The low-frequency signals generated in this way, with the second low value for the frequency of a maximum of 2 GHz, by way of example, subsequently pass through the filter front end 64 and the transceiver 66 and then reach the interface 68. Proceeding therefrom, the signals with the second low value for the frequency are transmitted via the line 72 to the device 70 and are processed and/or evaluated by the same.

All of the presented embodiments of the system 4, 32a, 32b, 52 have in common that between at least one antenna 8, 36, 56 of a vehicle 2, 30, 50 and the external apparatus 20, usually having at least one antenna of this apparatus 20, which can also be designed as a vehicle, when the vehicle 2, 30, 50 moves relative to the apparatus 20, the high-frequency signals are exchanged, the same formed in this case, for example, according to a 5G standard for a fifth generation mobile network. If these high-frequency signals will be transmitted from the at least one antenna 8, 36, 56 via the line 18, 44, 72 directly to the device 12, 40, 70 of the vehicle 2, 30, 50, there is a risk that during a transport of these signals along the line 18, 44, 72, considerable line losses, for example a line attenuation, can occur due to their high value for the frequency of several gigahertz.

By providing an embodiment of each system 4, 32a, 32b, 52 as described herein for such a vehicle 2, 30, 50 with at least one signal conversion module, that is to say at least one frequency reduction module 10, 62 and/or analog-to-digital converter 38, the originally high-frequency signals are converted into low-frequency signals and/or digitized in each embodiment of the method. When such low-frequency and/or digital signals are transported along the line 18, 44, 72 to the device 12, 40, 70, the line losses that otherwise would occur are reduced.

LIST OF REFERENCE NUMERALS vehicle 2
system 4
communication unit 6
antenna 8
frequency reduction module 10
device 12
frequency increasing module 14
transceiver 16
line 18
device 20
mixer 22
frequency oscillator 24
mixer 26
frequency oscillator 28
vehicle 30
system 32a
system 32b
communication unit 34a
communication unit 34b
antenna 36
analog-to-digital converter 38
device 40
digital-to-analog converter 42
line 44
vehicle 50
system 52
communication unit 54
antenna 56
phase shifter 58 combiner 60
frequency reduction module 62
filter front end 64
transceiver 66
interface 68
device 70
line 72
mixer 74
frequency oscillator 76

The invention claimed is:

1. A system, comprising:
a vehicle comprising:
  a device;
  an analog-to-digital converter;
  a digital-to-analog converter;
  a frequency conversion module; and
  an antenna; and
an external apparatus outside the vehicle,
wherein the device of the vehicle is configured to exchange high-frequency signals having a high value of frequency between the device of the vehicle and the external apparatus via the antenna of the vehicle using electromagnetic waves,
wherein the antenna is connected via a first path to a first end of a line of the vehicle, and the device is connected via a second path to a second end of the line of the vehicle,
wherein the analog-to-digital converter is arranged along at least the first path or the second path, and is configured to digitize the high-frequency signals prior to transport along the line,
wherein the digital-to-analog converter along at least the first path or the second path is configured to analogize the signals after the transport along the line, and
wherein the frequency conversion module is arranged along at least the first path or the second path.

2. The system of claim 1, wherein the frequency conversion module is a frequency reduction module configured to adjust the high value of the frequency of the high-frequency signals to a low value prior to transport along the line.

3. The system of claim 1, wherein the conversion module is a frequency increasing module configured to adjust low-frequency signals back to the high value of the frequency after transport along the line.

4. The system of claim 1, wherein the antenna, the frequency reduction module, and the analog-to-digital converter are arranged on a module along the first path.

5. The system of claim 1, wherein the first path to the first end of the line of the vehicle is made of electrically conductive metal.

6. The system of claim 1, wherein the high value of the frequency of the high-frequency signals is at least 5 GHz.

7. A method for exchanging signals between a device of a vehicle and an external apparatus outside the vehicle, the method comprising:
exchanging high-frequency signals having a high value of frequency between the device of the vehicle and the external apparatus via an antenna of the vehicle using electromagnetic waves;
digitalizing, by an analog-to-digital converter of the vehicle, the high-frequency signals prior to transport along a line connecting the device of the vehicle and the antenna of the vehicle;
analogizing, by a digital-to-analog converter, the high-frequency signals after transport along the line;
adjusting, by a frequency reduction module of the vehicle, the high value of the frequency of the high-frequency signals to a low value prior to transport along the line; and
adjusting, by a frequency increasing module, low-frequency signals back to the original high value of the frequency after transport along the line.

8. The method of claim 7, wherein the high value of the frequency of the high-frequency signals is at least 5 GHz.

9. The method of claim 7, wherein the antenna is connected via a first path to a first end of a line of the vehicle, and the device is connected via a second path to a second end of the line of the vehicle.

10. The method of claim 7, wherein the first path to the first end of the line of the vehicle is made of electrically conductive metal.

* * * * *